United States Patent [19]

Ambrosius, III et al.

[11] Patent Number: 4,473,760

[45] Date of Patent: Sep. 25, 1984

[54] FAST DIGITAL SAMPLE RESOLUTION CIRCUIT

[75] Inventors: William Ambrosius, III, Mission Viejo; Randall Chung, Laguna Niguel, both of Calif.

[73] Assignee: Western Digital Corporation, Irvine, Calif.

[21] Appl. No.: 448,971

[22] Filed: Dec. 13, 1982

[51] Int. Cl.[3] ........................ H03K 3/353; H03K 5/26; H03K 17/16; H03K 19/096

[52] U.S. Cl. .................................... 307/481; 307/443; 307/475; 307/528; 307/577; 307/583

[58] Field of Search .................... 307/200 B, 443, 453, 307/475, 480, 481, 527, 528, 353, 359, 546, 548, 550, 554, 562, 577, 581, 582, 583; 377/79, 105

[56] References Cited

U.S. PATENT DOCUMENTS

| | | | |
|---|---|---|---|
| 3,761,739 | 9/1973 | East et al. | 307/443 X |
| 3,935,474 | 1/1976 | Komarek | 307/481 |
| 3,935,475 | 1/1976 | Margolies | 307/481 |
| 3,947,697 | 3/1976 | Archer et al. | 307/480 |
| 3,953,744 | 4/1976 | Kawagoe | 307/453 X |
| 4,011,465 | 3/1977 | Alvarez, Jr. | 307/481 |
| 4,317,053 | 2/1982 | Shaw et al. | 307/480 X |
| 4,380,083 | 4/1983 | Andersson et al. | 307/480 X |

*Primary Examiner*—Stanley D. Miller
*Assistant Examiner*—David R. Hudspeth

[57] ABSTRACT

A fast digital sample resolution circuit comprising a dynamic ratioless inverter coupled to a static ratioed inverter, with positive capacitive feedback. A transistor node is precharged to one logic level. Any positive transition of an input signal causes the precharged node to begin discharging, thereby causing a capacitive feedback signal to rapidly reinforce the input signal. The resolution circuit minimizes the probability that its output is an ambiguous logic signal.

7 Claims, 2 Drawing Figures

SAMPLE RESOLUTION CIRCUIT

FAST DIGITAL SAMPLE RESOLUTION CIRCUIT

BACKGROUND OF THE INVENTION

This invention relates to sample resolution circuits, and more particularly to a fast digital sample resolution circuit for determining the logic level of an input signal.

In many instances in digital electronics, it is necessary to determine the logic level of a signal at a particular moment in time. For example, in interfacing asynchronous digital data signals from one circuit or source to another circuit, it is particularly necessary to synchronize the internal clock of the receiving circuit to the transmission rate of the incoming signal. One known method for such synchronization is to trigger an internal clock generator subcircuit in the receiving circuit upon receipt of a specified logic signal from the asynchronous circuit. Such a method has previously been used, for example, in synchronizing a disc controller circuit to the position of a rotating magnetic disc storage device.

In such a system, the system clock used in the controller circuit is derived by dividing a servoclock signal issued by the disc device. The system clock in the controller circuit thereby is frequency related to the rotation of the disc. Positional information is provided from the disc by a sector pulse signal. The sector pulse signal divides the disc into arcs of a given angle, each of which is reserved for a specifically addressed field of data. The phase of the system clock in the controller circuit is synchronized to the disc position by holding the servoclock divider to a pre-set condition until a sector pulse occurs during a clock pulse from the servoclock. Detection of the occurrence of the sector pulse enables the servoclock divider to begin generating the system clock, thereby providing a known phase relationship between the controller system clock and the position of the rotating disc.

One problem that occurs with this sampling and enabling technique is the difficulty of detecting that a logic state change has occurred in a sector pulse signal. There is some probability when a sector pulse signal line is sampled during a clock pulse from the servoclock that the incoming sector pulse may be in a transition from one logic state to the other. Thus, the sampling circuit may not resolve a particular sample in the required time in order to determine that the incoming sector pulse is the enabling signal for the servoclock divider circuit. If the sampling circuit does not resolve the logic value of the sector pulse properly, an anomolous logic "halfstate" may be propagated throughout a portion of the digital circuitry, causing incorrect operation.

The probability of the above situation occurring is proportional to the amount of time the incoming sector pulse is in transition relative to the rate of the servoclock period, and to the ability of the sampling circuit to resolve any sample value to an acceptable logic level (logic 0 or logic 1) during the servoclock time period.

As the incoming clock rate increases, it becomes increasingly important to resolve any sample value to an acceptable logic level in a correspondingly shorter period of time, and faster sampling circuits are required since prior art methods of sampling and resolving input data values are not adequate.

It is therefore an object of this invention to provide a new and improved fast digital sample resolution circuit that rapidly resolves the logic state of an input signal.

The present invention achieves the above function with a simple and inexpensive metal oxide semiconductor (MOS) field effect transistor (FET) circuit, described in full below.

SUMMARY OF THE INVENTION

The present invention provides a simple but extremely fast digital sample resolution circuit. For purposes of clarity only, the preferred embodiment of the invention is described in the context of its use with a digital synchronization circuit in a magnetic disc controller circuit.

The invention itself utilizes a combination of a dynamic ratioless inverter circuit, a static ratioed inverter circuit, and positive capacitive feedback to rapidly detect and reinforce the logic state of an incoming signal.

The signal input to be sampled and resolved is coupled by means of a MOS FET gate to the input FET of a dynamic ratioless inverter. The coupling gate is controlled by means of a clock signal from the servoclock. The output of the ratioless inverter is coupled to the input of a static ratioed inverter. The output of the static ratioed inverter is capacitively coupled back to the input FET of the ratioless inverter.

Upon the occurrence of a logical one servoclock signal, the input signal is gated to the input FET of the ratioless inverter, and the node coupling the ratioless inverter with the ratioed inverter is precharged. When the servoclock signal returns to logical zero, any charge above the threshold voltage of the input FET of the ratioless inverter (representing a possibly ambiguous logical one) discharges the precharged node, and is thereby rapidly amplified by the coupled ratioless inverter and ratioed inverter. The output from the ratioed inverter is fed back through the coupling capacitor to the ratioless inverter input, thus amplifying or reinforcing the input signal to the ratioless inverter. The positive feedback by the capacitor enhances the ability of the circuit to rapidly resolve a logical one in the input signal. The resolution circuit minimizes the probability than an unambiguous logic signal is sent to the remainder of the digital system.

DESCRIPTION OF THE DRAWINGS

The invention will become better understood by reference to the following detailed description when taken in conjunction with the accompanying drawings showing the preferred embodiment of the invention.

DESCRIPTION OF THE PREFERRED EMBODIMENT

Figure 1:
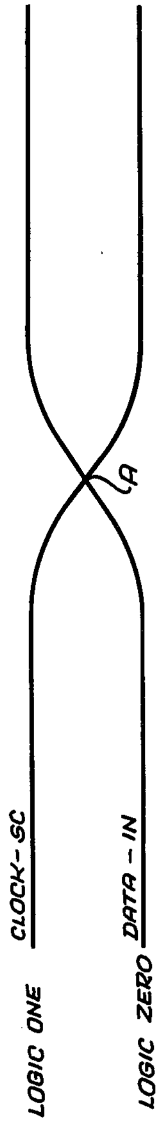
FIG. 1 is a timing diagram showing the nature of the problem solved by the present invention.

FIG. 1 is a timing diagram showing the nature of the problem solved by the present invention. In a typical synchronizing circuit, input data is sampled only during a specified period of time. However, the input data signal may be in transition from one logic state to the other state during a portion of the time that a clock or enabling signal is also in transition but still enabling the synchronizing circuit to accept the input data signal (see point A in FIG. 1). There is some probability that the synchronizing circuit cannot completely resolve the logic level of the data signal in such a case. The present invention minimizes this probability with a unique circuit.

Figure 2:
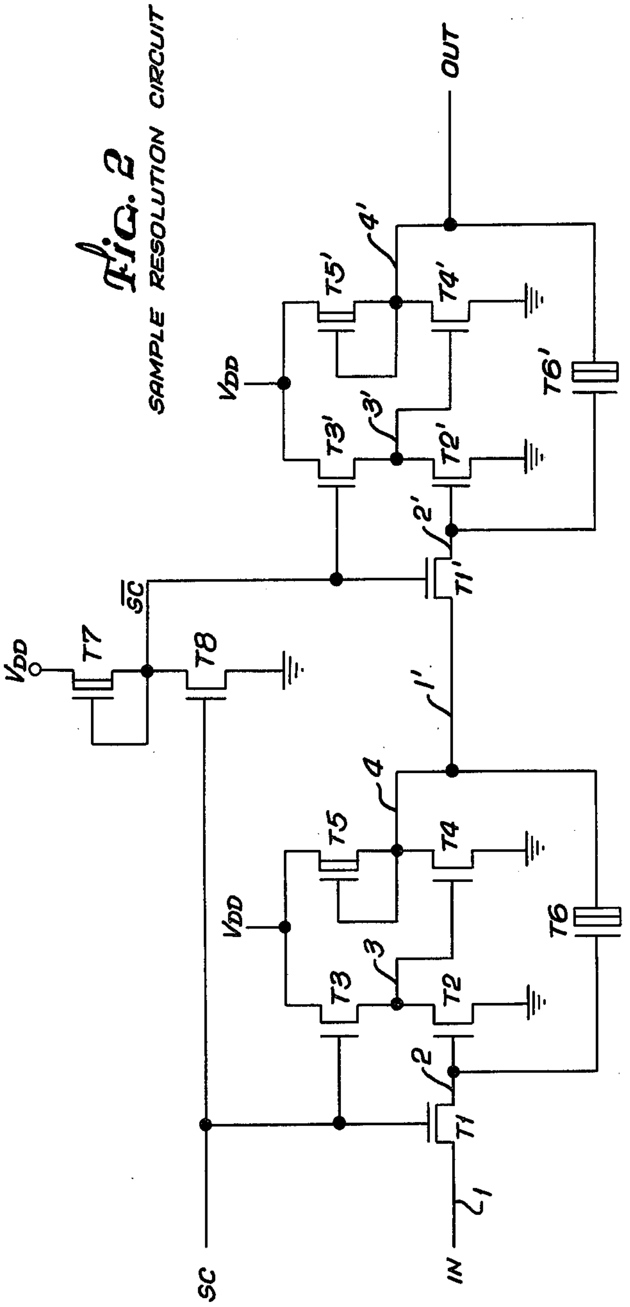
FIG. 2 is a schematic diagram of the fast sample resolution circuit of the present invention.

FIG. 2 is a schematic diagram of the preferred embodiment of the digital sample resolution circuit of the present invention. The preferred embodiment is shown implemented in NMOS enhancement and depletion FET technology. The preferred embodiment is optimized for detecting positive-transition voltage changes, but also detects negative-transition voltage changes. It would be well within the capabilities of one skilled in the art to utilize the concepts taught by the present invention and adapt the present invention to PMOS technology or other technologies having comparable characteristics to NMOS technology, or to optimize the circuit for detecting negative-transition voltage changes.

FIG. 2 shows the preferred embodiment for implementing a two-phase single stage fast digital sample resolution circuit. The servoclock (SC) signal is a clocking signal which bears no fixed phase relationship to the incoming sector pulse (IN) signal. Both the SC and IN signals are encoded on and read from a magnetic disc by means well known in the art. As known in the prior art, a change in state from a logic zero to a logic one by the IN signal during a particular time period constitutes a phase-synchronization signal. The preferred embodiment of the present invention is particularly adapted for unambiguously detecting such a change in logic state.

Enhancement MOS transistors T1, T2, and T3 comprise a gated dynamic ratioless inverter. Depletion MOS transistor T5 and enhancement MOS transistor T4 comprise a ratioed inverter coupled to the output of the dynamic ratioless inverter.

Device T6 is a depletion gate capacitor that couples the output (node 4) of the ratioed inverter to the input FET (node 2) of the ratioless inverter. In the present embodiment, device T6 should be fairly small in value, and the gate of device T6 should be coupled to node 2 so that the output from node 4 does not have to drive the additional substrate capacitive load that the reverse coupling would create.

Looking only at the first-phase portion of the circuit, when the SC signal is at a logic one (approximately +5 volts DC), transistors T1 and T3 are conductive. The IN signal value on node 1 is thus transferred through transistor T1 to node 2, which is the gate of transistor T2. Also, node 3 is pre-charged to a logical one level through transistor T3.

If the IN signal is not in transition from a logic zero to a logic one level when the SC clock signal returns to a logic zero level (approximately zero volts), which makes transistors T1 and T3 nonconductive, the logic level of node 4 will be unambiguously the same as the logic level of node 2.

Thus, if the IN signal at node 2 is clearly less than the threshold voltage of transistor T2, the input signal is considered to be a logical zero, and transistor T2 does not conduct. In this state, the pre-charged voltage at node 3 remains approximately the same as the supply voltage, $V_{dd}$. Thus, transistor T4 is conductive, thereby essentially grounding node 4 and unambiguously holding it at a logic zero level.

On the other hand, if the IN signal at node 2 is clearly above the threshold voltage of transistor T2, the input signal is considered to be a logical one, and transistor T2 conducts. In this state, the voltage at node 3 is some undetermined intermediate value between zero volts and $V_{dd}$. However, when the SC clock signal returns to a logic zero level, transistors T1 and T3 become nonconductive. Node 3 is discharged to ground through transistor T2, which remains conductive due to the input signal charge trapped on node 2. Node 3 therefore is pulled essentially to a logic zero level, making transistor T4 nonconductive and causing node 4 to attain a voltage value approximately equal to that of the power supply voltage, $V_{dd}$, through transistor T5. Node 4 thus unambiguously represents a logical one.

However, if the IN signal is in transition from a logic zero to a logic one level at essentially the same time that the SC clock signal is transitioning from a logic one to a logic zero level, a possible ambiguity in the detected logic state of the IN signal may result. That is, the voltage value on the gate of transistor T2 may be at approximately the threshold voltage of that transistor, and transistor T2 may not be fully conductive or fully nonconductive. If that state is not resolved, an intermediate value voltage signal may be propagated through the circuit, thereby causing an error in other circuits connected to this circuit. The present invention resolves this problem by the unique combination of a dynamic ratioless inverter coupled to a static ratioed inverter with a capacitive feedback loop between them.

As noted, when the SC clock signal is at a logic one level, node 3 is precharged through transistor T3 to a logic one voltage value that makes transistor T4 conductive. For any voltage value at node 2 that is clearly less than the threshold voltage of transistor T2, transistor T2 remains nonconductive and node 3 remains unchanged. If the IN signal begins to transition from a logic zero level to a logic one level, even during the time the SC clock signal is transitioning from a logical one to a logical zero, any voltage from the IN input signal is trapped as a charge on node 2 as transistor T1 becomes nonconductive. If this trapped charge is less than the threshold voltage of transistor T2, transistor T2 will not conduct, node 3 will not be discharged, and transistor T4 will remain conductive. Hence the output of node 4 will remain unchanged at a logic zero level. If, however, the charge trapped on node 2 causes transistor T2 to conduct at all, the charge trapped on node 3 will begin to be discharged through transistor T2 to ground. This discharge of node 3 will cause transistor T4 to become less conductive, thereby causing node 4 to begin charging towards a logic one level. As node 4 begins charging to a logic one level, the depletion capacitor T6 couples this change in voltage to node 2, thus increasing the input voltage to transistor T2 and making it more conductive. The greater conductivity of transistor T2 discharges node 3 even more rapidly. This feedback loop thus quickly causes node 4 to achieve a logic one level, thereby resolving the ambiguous state of the IN input signal.

The second phase circuit of the sample resolution circuit shown operates identically to the first phase circuit, except that the clocking signal $\overline{SC}$ to transistors T1' and T3' is the inverse of the SC clocking signal to the first phase circuit. Enhancement transistor T7 and depletion transistor T8 are coupled to the SC clock signal as a simple inverter for deriving the $\overline{SC}$ signal. Devices T1', T2', T3', T4', T5', and T6' function identically to their counterparts in the first phase circuit.

As FIG. 2 shows, the input signal to the second phase circuit is the output signal from the first phase circuit. Together, the two circuits achieve one full clock-time of bit delay, which means that the sample resolution circuit output is fully in phase with the SC clock signal, and thus can be used in the remainder of the synchronous circuit system.

The resolution capability of the sample resolution circuit of the present invention can be enhanced by cascading a number of the circuits. For a given probability p of any one circuit not resolving a sample, the probability P of the output of a cascaded system not resolving a sample is $P=p^n$, where n is the number of circuits cascaded.

While this invention has been described with reference to a preferred embodiment, it is not intended that this description be construed in a limiting sense. For example, the inventive circuit may be optimized for detecting negative-transition voltage changes by simply first inverting the IN input signal and then applying the inverted ($\overline{IN}$) input signal to the input of transistor T1. An inverter of the type formed by transistors T7 and T8 may be used for this purpose. Various other modifications of the preferred embodiment, as well as other embodiments of the invention, will be apparent to persons skilled in the art upon reference to this description. It is therefore contemplated that the appended claims will cover any modifications or embodiments as fall within the true scope of the invention.

We claim:

1. A digital sample resolution circuit comprising:
(a) a dynamic ratioless inverter having a gated input and a non-gated input, wherein an input signal is coupled to the gated input;
(b) a ratioed inverter, the input of which is coupled to the output of the ratioless inverter; and
(c) a feedback capacitor coupling the output of the ratioed inverter to the non-gated input of the ratioless inverter.

2. The digital sample resolution circuit of claim 1 wherein the dynamic ratioless inverter is comprised of:
(a) a first enhancement field effect transistor coupled to the input signal, the gate of the first transistor being coupled to receive a clock signal;
(b) a second enhancement field effect transistor, the gate of which is coupled to the output of the first transistor, and the source of which is coupled to ground; and
(c) a third enhancement field effect transistor, the gate of which is coupled to receive the clock signal, the drain of which is coupled to a voltage source, and the source of which is coupled to the drain of the second transistor.

3. The digital sample resolution circuit of claim 1 wherein the ratioed inverter comprises:
(a) an enhancement field effect transistor, the gate of which is coupled to the output of the ratioless inverter, the source of which is coupled to ground; and
(b) a depletion field effect transistor, the drain of which is coupled to a voltage source, and the gate and source of which are coupled to the drain of the enhancement transistor.

4. A digital sample resolution circuit comprising:
(a) a field effect transistor dynamic ratioless inverter having a gated input and a non-gated input, wherein an input signal is coupled to the gated input, and a clock signal controls the gated input and a power supply to the ratioless inverter;
(b) a static ratioed inverter, the input of which is coupled to the output of the ratioless inverter; and
(c) a feedback capacitor coupling the output of the ratioed inverter to the non-gated input of the ratioless inverter.

5. The digital sample resolution circuit of claim 4 wherein the input of the ratioed inverter is precharged from the gated power supply of the ratioless inverter during the presence of a clock signal, and discharged when the clock signal is absent and the input signal is greater than the threshold voltage of the non-gated input of the ratioless inverter.

6. The digital sample resolution circuit of claim 5 wherein voltage feedback from the ratioed inverter through the capacitor to the ratioless inverter increases the discharge rate of the ratioless inverter.

7. A field effect transistor digital sample resolution circuit comprising:
(a) a first enhancement transistor leaving its drain-source current path coupled to receive an input signal, the gate of the first transistor being coupled to receive a clock signal;
(b) a second enhancement transistor, the gate of which is coupled to the drain-source current path output of the first transistor, and the source of which is coupled to ground;
(c) a third enhancement transistor, the gate of which is coupled to receive the clock signal, the drain of which is coupled to a voltage source, and the source of which is coupled to the drain of the second transistor;
(d) a fourth enhancement transistor, the gate of which is coupled to the drain of the second transistor, the source of which is coupled to ground;
(e) a fifth depletion transistor, the drain of which is coupled to the voltage source, and the gate and source of which are coupled to the drain of the fourth transistor; and
(f) a depletion capacitor, the gate terminal of which is coupled to the gate of the second transistor, the other terminal being coupled to the drain of the fourth transistor;

wherein the gate of the fourth transistor is precharged through the third transistor when a clock signal is present, and is discharged through the second transistor when the clock signal is absent and the input signal is greater than the threshold voltage of the second transistor, and wherein voltage feedback through the capacitor increases the discharge rate of the second transistor when such an input signal is present.

* * * * *